(12) United States Patent
Huang

(10) Patent No.: US 8,629,032 B2
(45) Date of Patent: Jan. 14, 2014

(54) NON-VOLATILE MEMORY CELL STRUCTURE AND A METHOD OF FABRICATING THE SAME

(75) Inventor: Sheng He Huang, Singapore (CN)

(73) Assignee: Systems On Silicon Manufacturing Co. Pte. Ltd., Singapore (SG)

( * ) Notice: Subject to any disclaimer, the term of this patent is extended or adjusted under 35 U.S.C. 154(b) by 278 days.

(21) Appl. No.: 13/008,407

(22) Filed: Jan. 18, 2011

(65) Prior Publication Data

US 2012/0181595 A1 Jul. 19, 2012

(51) Int. Cl.
*H01L 21/331* (2006.01)

(52) U.S. Cl.
USPC .......................................... 438/329; 438/241

(58) Field of Classification Search
USPC .......................................... 438/239, 241, 268
See application file for complete search history.

(56) References Cited

U.S. PATENT DOCUMENTS

| | | | | |
|---|---|---|---|---|
| 5,521,110 A | * | 5/1996 | Gill | 438/263 |
| 5,843,817 A | * | 12/1998 | Lee et al. | 438/239 |
| 6,157,058 A | * | 12/2000 | Ogura | 257/315 |
| 6,365,929 B2 | * | 4/2002 | Smolen | 257/315 |

* cited by examiner

*Primary Examiner* — Howard Weiss
*Assistant Examiner* — Steven Rao
(74) *Attorney, Agent, or Firm* — Pillsbury Winthrop Shaw Pittman, LLP

(57) ABSTRACT

A non-volatile memory cell structure and a method of fabricating the same. The method comprising the steps of: fabricating a portion of a floating gate from one or more first metal local interconnection layer (LIL) slit contacts deposited on a patterned dielectric layer; and fabricating a portion of a control gate from one or more second metal LIL slit contacts deposited on the patterned dielectric layer; wherein the first and second metal LIL slit contacts form a capacitive structure between the floating gate and the control gate.

12 Claims, 5 Drawing Sheets

- PRIOR ART -

- PRIOR ART -

US 8,629,032 B2

NON-VOLATILE MEMORY CELL STRUCTURE AND A METHOD OF FABRICATING THE SAME

FIELD OF INVENTION

The invention broadly relates to a non-volatile memory cell structure and a method of fabricating the same.

BACKGROUND

Non volatile memory devices (e.g. electrically erasable programmable read only memory (EEPROM)) typically use floating gate metal oxide semiconductor technology to store data. Each memory cell contains a floating gate MOS transistor. A logical state is written into the memory cell by providing a required voltage between the substrate, source, gate and drain of the floating gate MOS transistor in order to cause tunneling of electrons (Fowler-Nordheim tunnelling) from the substrate through the floating gate oxide insulator onto the floating gate. The other logical state is written by providing specific voltages between the source, gate and drain which discharge electrons from the floating gate of the memory cell by tunneling electrons through the floating gate oxide insulator layer (sometimes known as the tunnel oxide) from the floating gate to the substrate. A capacitive structure within the memory cell, comprising the floating gate, control gate and dielectric, store charges and of the presence/absence of a charge determines the value (1 or 0) of the memory cell.

FIG. 1(a) is a cross-sectional diagram, designated generally as reference numeral 100, of a typical prior art non-volatile memory (NVM) cell, such as an electrically erasable programmable read only memory (EEPROM). The cell comprises a control gate 102, a floating gate 104 and a substrate layer 106. An n+ source 108 and an n+ drain 110 are disposed in the p-type substrate layer 106. The floating gate 104 is disposed above the substrate layer 106 and comprises a stacked silicon dioxide (gate oxide) layer 111, poly layer 112, contact 114 and metal pad 116. The poly layer 112 is disposed above the silicon dioxide layer 111 while the contact 114 is disposed above the poly layer 112 and below the metal layer 116. The metal pad 116 is typically made of aluminium. The control gate 102 is formed in the same metal layer and is disposed around the metal pad 116 to form a "ring" around the metal pad 116. A dielectric 118 is disposed above the substrate layer 106 and fills the space between the control gate 102 and the floating gate 104.

FIG. 1(b) is a perspective view, designated generally as reference numeral 150, of the typical prior art non-volatile memory (NVM) cell described above.

FIGS. 2(a)-(e) are schematic cross-sectional diagrams illustrating the fabrication process of the metal pad 116 and control gate 102 of the typical prior art non-volatile memory (NVM) cell described above. In FIG. 2(a), a metal layer 202, made from a suitable metal such as aluminium, is deposited. The aluminium is typically deposited through a sputtering process (physical vapour deposition (PVD)). In FIG. 2(b), a photoresist 204 is patterned over the metal layer 202. In FIG. 2(c), the metal layer 202 is selectively etched such that the portions of the metal layer 202a/b underlying the photoresist remain. In FIG. 2(d), a dielectric layer 206 is deposited over the remaining portions of the metal layer 202a/b. The dielectric layer 206 is usually made from silicon dioxide. In FIG. 2(e), a suitable process such as chemical-mechanical polishing is used to planarize the dielectric layer 206; the metal layer 202a corresponds to the left portion of the control gate 102a while the metal layer 202b corresponds to the metal layer 116. The right portion of the control gate is not shown in FIG. 2(e). As will be appreciated, the metal layer formation is thus typically a low aspect ratio process.

With reference to FIG. 1(b), typical prior art non-volatile memory (NVM) cells make use of the capacitance between the metal control gate and the metal floating gate. In other words, the area of overlap between the control gate 102 "ring" and the metal pad 116 of the floating gate 104 form the non-volatile memory cell's coupling capacitor. However, memory cells with this structure are relatively larger and provide limited capacitor area, due to the low aspect ratio of the metal layer-formed gates. Herein, aspect ratio is defined as the ratio between the depth and the width of a structure.

Furthermore, the area of overlap between the control gate and the metal layer of the floating gate in a typical prior art non-volatile memory cell is relatively small, consequently resulting in relatively lower capacitance and hence a larger voltage is require to program the non-volatile memory cell.

A need therefore exists to provide non-volatile memory cell structure and a method of fabricating the same that seeks to address at least one of the abovementioned problems.

SUMMARY

According to a first aspect of the present invention, there is provided a method of fabricating a non-volatile memory cell, the method comprising the steps of: fabricating a portion of a floating gate from one or more first metal local interconnection layer (LIL) slit contacts deposited on a patterned dielectric layer; and fabricating a portion of a control gate from one or more second metal LIL slit contacts deposited on the patterned dielectric layer; wherein the first and second metal LIL slit contacts form a capacitive structure between the floating gate and the control gate.

The method may further comprise fabricating another portion of the control gate from one or more metal contacts formed by patterning a metal layer.

The method may further comprise fabricating another portion of the floating gate from poly silicon pads formed by patterning a poly silicon layer.

The one or more first and second metal LIL slit contacts may comprise tungsten.

The one or more metal contacts may comprise tungsten.

In the formation of a row of memory cells, the floating gate of each cell may comprise a pair of the first metal LIL slit contacts and the control gate of each cell may comprise a pair of the second metal LIL slit contacts; and each of the second metal LIL slit contacts is disposed adjacent to each of the respective first metal LIL slit contacts.

In the formation of the non-volatile memory cell, the one or more second metal LIL slit contacts of the control gate may extend continuously across one or more other non-volatile memory cells.

According to a second aspect of the present invention, there is provided a non-volatile memory cell comprising: a floating gate comprising a portion fabricated from one or more first metal local interconnection layer (LIL) slit contacts deposited on a patterned dielectric layer; and a control gate comprising a portion fabricated from one or more second metal LIL slit contacts deposited on the patterned dielectric layer; wherein the first and second metal LIL slit contacts form a capacitive structure between the floating gate and the control gate.

The control gate may further comprise another portion fabricated from one or more metal contacts formed by patterning a metal layer.

The floating gate may further comprise another portion fabricated from poly silicon pads formed by patterning a poly silicon layer.

The one or more first and second metal LIL slit contacts may comprise tungsten.

The one or more metal contacts may comprise tungsten.

The floating gate may comprise a pair of the first metal LIL slit contacts and the control gate may comprise a pair of the second metal LIL slit contacts; and each of the second metal LIL slit contacts may be disposed adjacent to each of the respective first metal LIL slit contacts.

The one or more second metal LIL slit contacts of the control gate may extend continuously across one or more other non-volatile memory cells.

BRIEF DESCRIPTION OF THE DRAWINGS

Example embodiments of the invention will be better understood and readily apparent to one of ordinary skill in the art from the following written description, by way of example only, and in conjunction with the drawings, in which.

DETAILED DESCRIPTION

Figure 1:
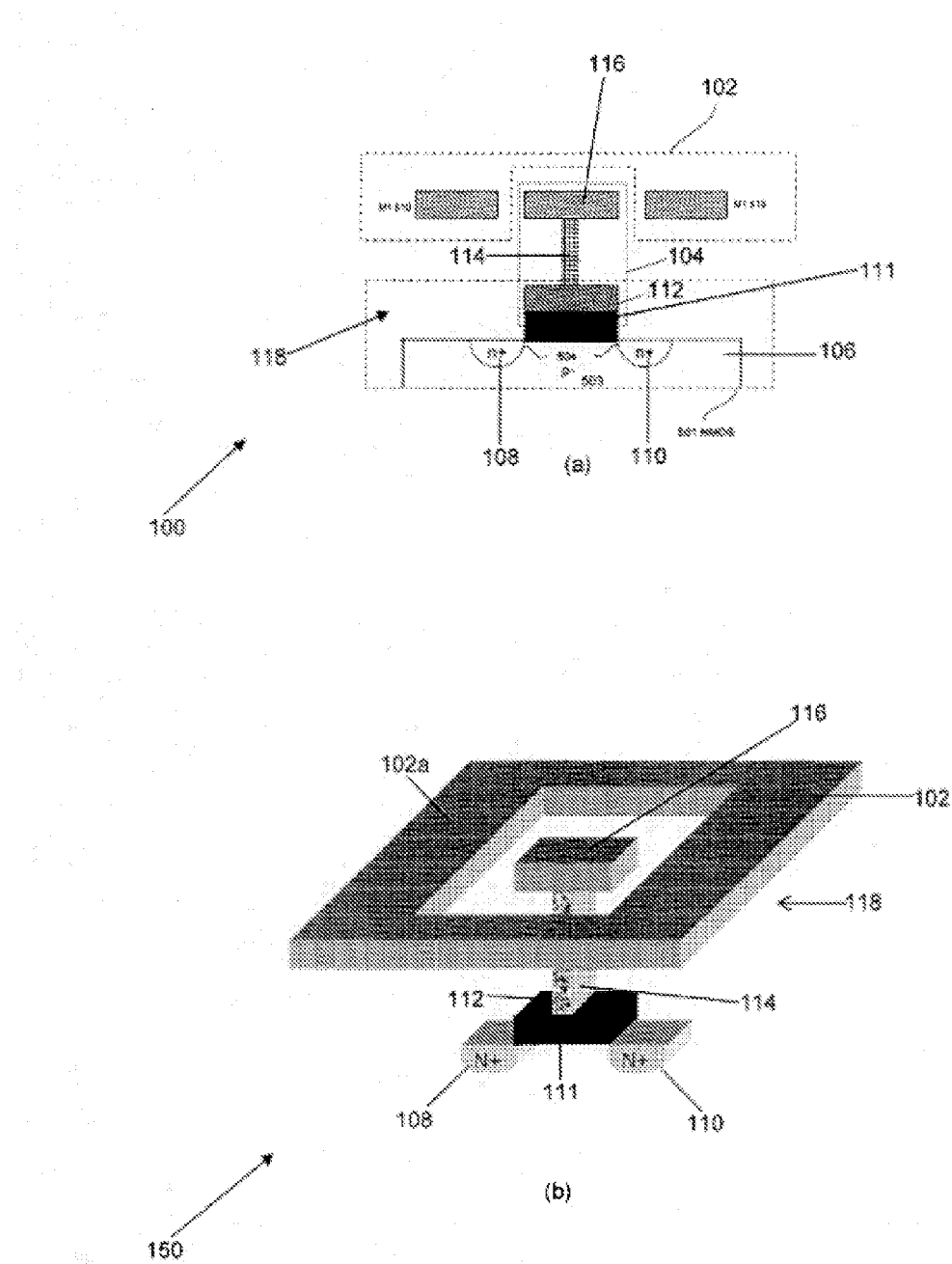
FIG. 1(a) is a cross-sectional diagram of a typical prior art non-volatile memory (NVM) cell, such as an electrically erasable programmable read only memory (EEPROM).
FIG. 1(b) is a perspective view of a typical prior art non-volatile memory (NVM) cell.
Figure 2:
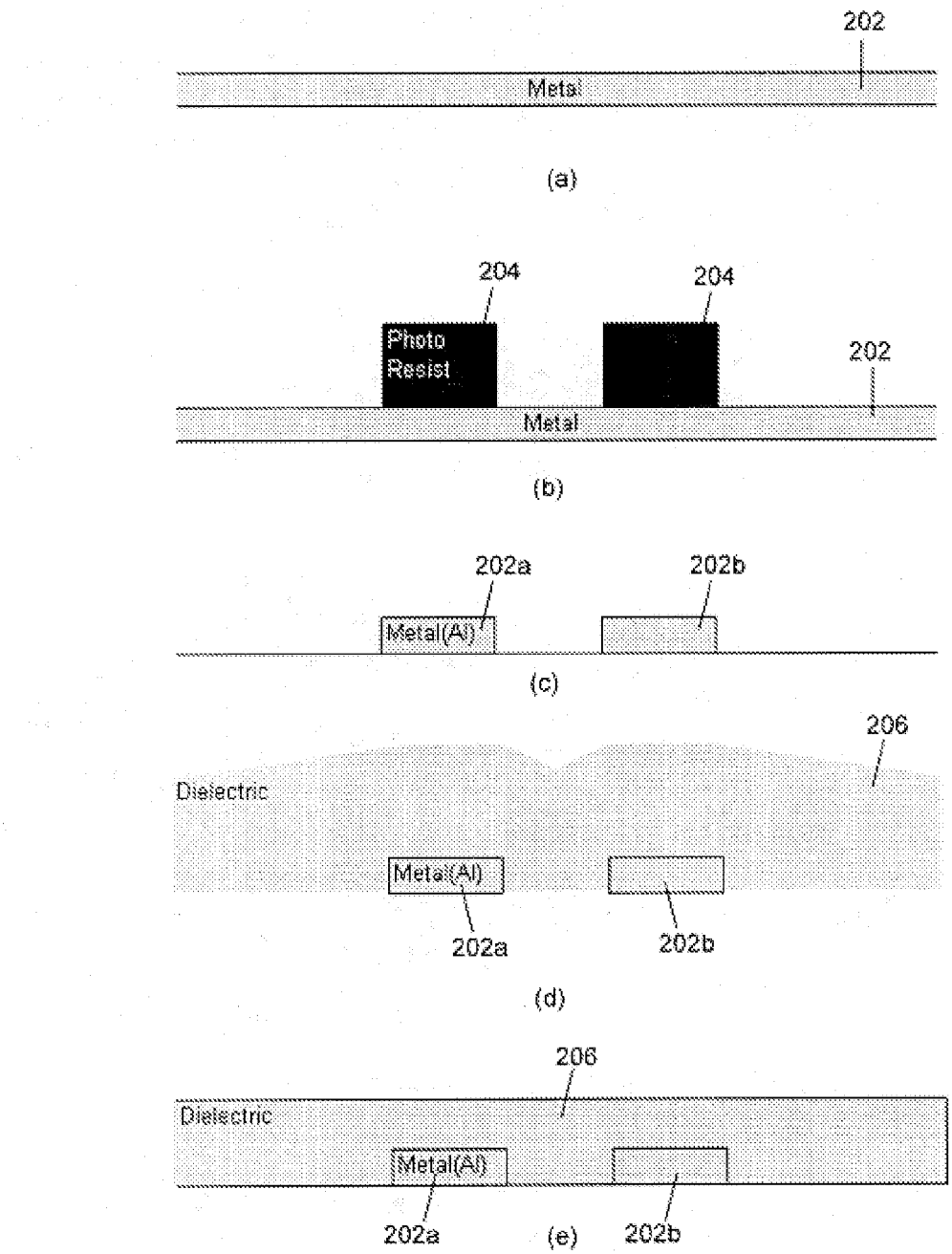
FIGS. 2(a)-(e) are schematic cross-sectional diagrams illustrating the fabrication process of a metal layer and control gate of a typical prior art non-volatile memory (NVM) cell.

FIG. 3(a) is a cross-sectional diagram, designated generally as reference numeral 300, of an array of non-volatile memory (NVM) cells, such as electrically erasable programmable read only memory (EEPROM) cells, according to an embodiment of the present invention. A single memory cell is designated as reference numeral 322. The cell 322 comprises a control gate 302, a floating gate 304 and a p-type substrate layer 306. The p-type substrate layer 306 comprises two shallow trench isolation (STI) structures 308/310. The floating gate 304 is disposed above the substrate layer 306 and comprises a gate oxide layer 315, a poly pad 312 (formed within a polysilicon layer 311) and two metal slit contacts 314 formed within a local interconnection layer (LIL) 313 in a U-shape. The width of the slit contacts 314 are about 0.12-0.36 μm. The slit contacts 314 are preferably made of Tungsten. The control gate 302 is preferably disposed above either one of the two shallow trench isolation (STI) structures 308/310. The control gate 302 comprises stacked layers of slit contacts 314, metal point contact 316 and metal pad 318. The metal point contact 316 and metal pad 318 are formed within the metal layer 317. The metal point contact 316 is preferably made of tungsten while the metal pad 318 is made of aluminium. The slit contacts 314 are formed within the LIL 313 and are disposed above the substrate layer 306 and below the metal point contact 316 and metal pad 318. A dielectric 320 is disposed above the substrate layer 306 and fills the space between the control gate 302 and the floating gate 304.

FIG. 3(b) is a perspective view, designated generally as reference numeral 350, of the array of non-volatile memory (NVM) cells described above. A single memory cell is designated as reference numeral 322. In one single memory cell 322, the slit contacts of the floating gate are discrete between different cells while the slit contacts of the control gate extend across respective rows of memory cells for electrical connection. In this example embodiment, a pair of control gate "rails" are used to control respective pairs of floating gates of each cell in a column.

Figure 4:
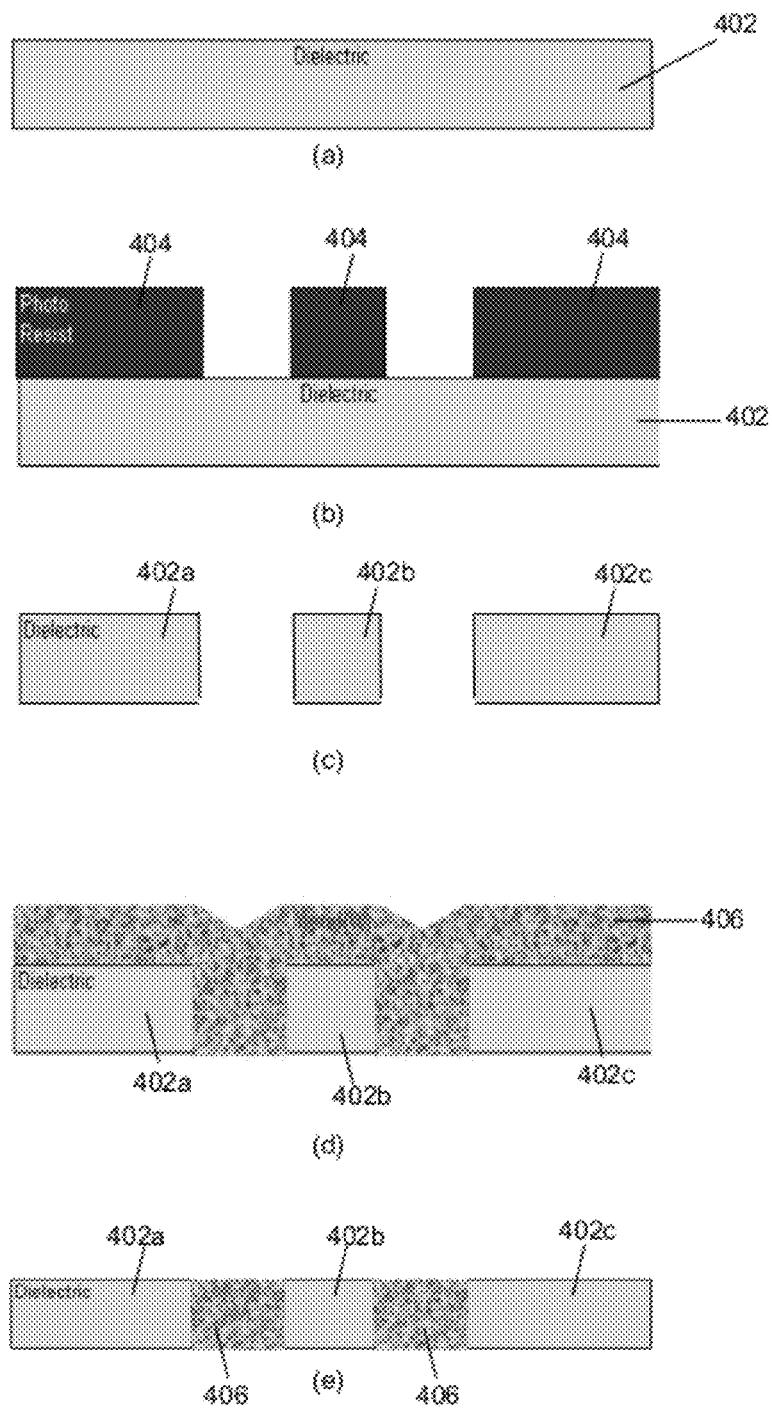
FIGS. 4(a)-(e) are schematic cross-sectional diagrams illustrating the fabrication process of a slit contact of a local interconnection layer (LIL) of a non-volatile memory (NVM) cell, such as an electrically erasable programmable read only memory (EEPROM), according to an embodiment of the present invention.

The slit contact of the LIL can be fabricated by a damascene process. FIGS. 4(a)-(e) are schematic cross-sectional diagrams illustrating the fabrication process of a slit contact of a local interconnection layer (LIL) of a non-volatile memory (NVM) cell, such as an electrically erasable programmable read only memory (EEPROM), according to an embodiment of the present invention. In FIG. 4(a), a dielectric layer 402 is deposited. The dielectric can be made from silicon dioxide and is deposited though any suitable process (e.g. low pressure chemical vapour deposition (LPCVD)). In FIG. 4(b), a photoresist 404 is patterned over the dielectric layer 402. In FIG. 4(c), the dielectric layer 402 is selectively etched such that the portions of the dielectric layer 402a/b/c underlying the photoresist remain. In FIG. 4(d), a metal layer 406 is deposited over the portions of the remaining dielectric layer 402a/b/c. The metal is preferably tungsten and can be deposited using chemical vapour deposition (CVD). In FIG. 4(e), a suitable process such as chemical-mechanical polishing is used to planarize the upper portion of the metal layer 406 such that the metal layer 406 is substantially flush with the remaining portions of dielectric layer 402a/b/c. The discontinuous metal layer 406 forms the slit contacts of the local interconnection layer (LIL). The remaining portions of dielectric layer 402a/b/c are interspersed between adjacent slit contacts.

In general, capacitance (C) is related to charge (Q) and voltage (V) by the formula:

$$C = \frac{Q}{V} \quad (1)$$

Therefore, for a certain amount of charge (Q), capacitance is inversely proportional to voltage (V). Accordingly, to advantageously reduce the voltage (V) required to program a non-volatile memory cell, one can increase the capacitance (C).

The general formula for capacitance (C) is:

$$C = \varepsilon_r \varepsilon_o \frac{A}{d} \quad (2)$$

where A is the area of overlap of the two charge plates, $\varepsilon_r$ is the dielectric constant of the material between the plates, $\varepsilon_o$ is a constant ($\approx 8.854 \times 10^{-12}$ Fm$^{-1}$), and d is the separation between the plates.

Figure 3:
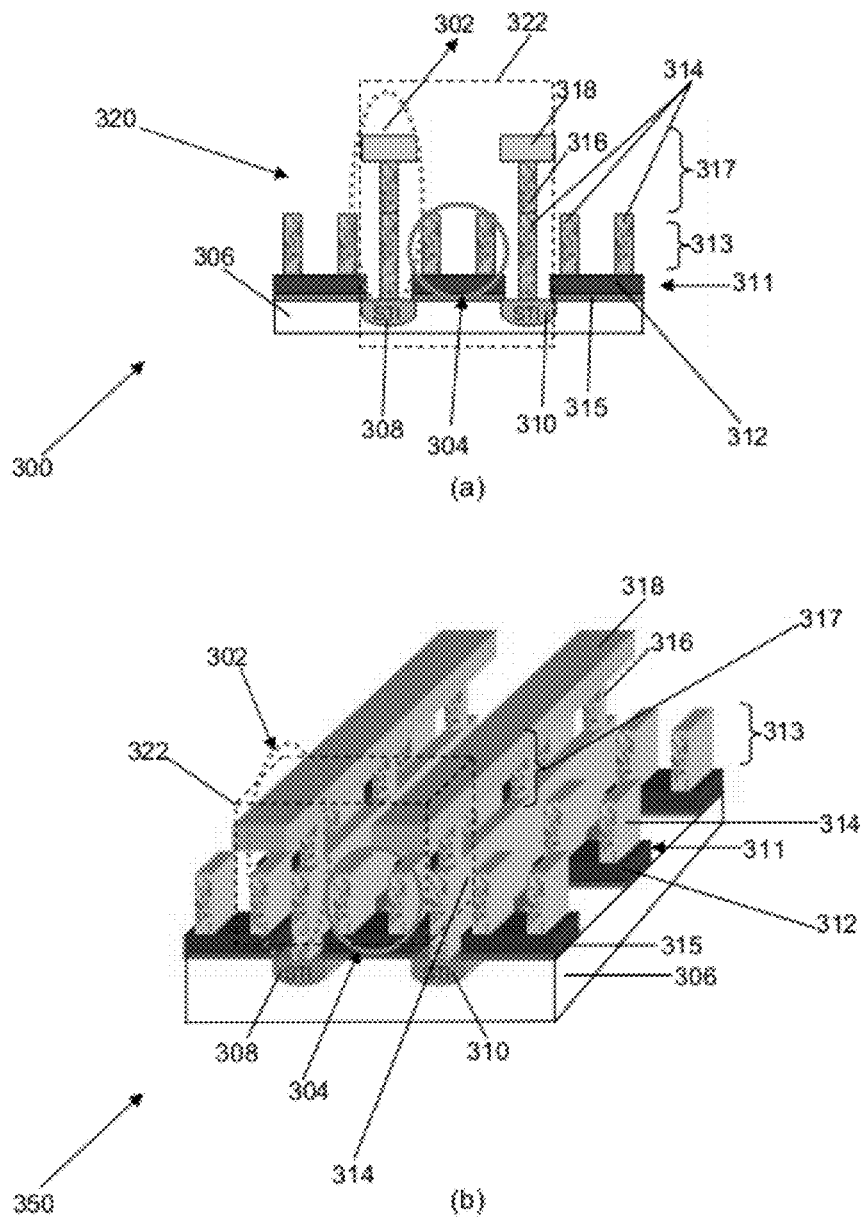
FIG. 3(a) is a cross-sectional diagram of an array of non-volatile memory (NVM) cells, such as an electrically erasable programmable read only memory (EEPROM) cells, according to an embodiment of the present invention.
FIG. 3(b) is a perspective view, of the array of non-volatile memory (NVM) cells shown in FIG. 3(a).

In embodiments of the present invention, a non-volatile memory cell comprises a capacitive structure (coupling capacitor) comprising local interconnection layers (LIL), such as those illustrated in FIG. 3 (reference numeral 314). A dielectric is disposed between the local interconnection layers. The capacitive "charge plates" in the non-volatile memory cell capacitive structure is formed by the overlapping area between two adjacent LILs, wherein one LIL belongs to the floating gate and the other adjacent LIL belongs to the control gate.

In the prior art, the coupling capacitor is formed from the metal to metal capacitance between a metal control gate and the metal portion of the floating gate. In particular, with reference to FIG. 1, the area of overlap of the two charge plates (A) corresponds to the area of overlap between the metal pad 116 of the floating gate 104 and the "ring-like" metal control gate 102. The heights of a typical prior art metal control gate and metal portion of the floating gate are about 0.2-0.6 μm. The separation between the metal control gate and the metal portion of the floating gate is typically about 0.16-0.48 μm.

In contrast, in embodiments of the present invention, the area of overlap of the two charge plates corresponds to the area of overlap between adjacent slit contacts of the local interconnection layer. In one example embodiment, the height of the slit contacts are about 0.4-1.2 μm and the separation between adjacent slit contacts are about 0.16-0.48 μm. In embodiments of the present invention, as the height of the slit contacts may be about double of the prior art metal control gate and metal portion of the floating gate, the area of overlap is substantially larger than that in the prior art, for comparable lateral size of the structure. By increasing the area of overlap of the two charge plates, the capacitance (C) of the coupling capacitor can be increased. In turn, the voltage (V) required to program non-volatile memory cell is advantageously reduced.

Thus, in embodiments of the present invention, due to the relatively high aspect ratio of the LIL slit contacts (compared to the prior art described above), the unit non-volatile memory cell size can advantageously be made smaller, while providing a large capacitor area, compared with metal layer-formed gates.

Furthermore, the fabrication process described above is compatible with current non-volatile memory fabrication process flows involving local interconnection layers.

Figure 5:
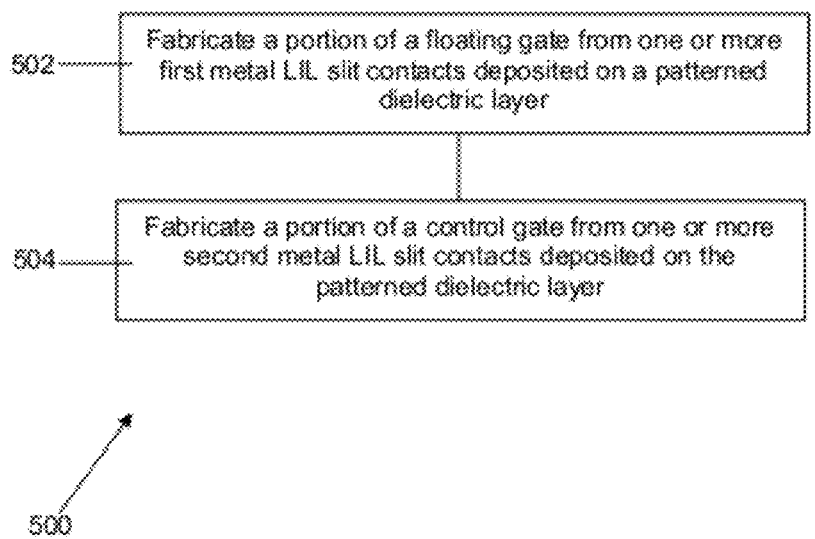
FIG. 5 is a flowchart illustrating a method of fabricating a non-volatile memory cell, according to an embodiment of the present invention.

FIG. 5 is a flowchart, designated generally as reference numeral 500, illustrating a method of fabricating a non-volatile memory cell, according to an embodiment of the present invention. At step 502, a portion of a floating gate is fabricated from one or more first metal local interconnection layer (LIL) slit contacts deposited on a patterned dielectric layer. At step 504, a portion of a control gate is fabricated from one or more second metal LIL slit contacts deposited on the patterned dielectric layer. The first and second metal LIL slit contacts form a capacitive structure between the floating gate and the control gate.

It will be appreciated by a person skilled in the art that numerous variations and/or modifications may be made to the present invention as shown in the embodiments without departing from a spirit or scope of the invention as broadly described. The embodiments are, therefore, to be considered in all respects to be illustrative and not restrictive.

The invention claimed is:

1. A method of fabricating a non-volatile memory cell, the method comprising the steps of:
    fabricating a U-shaped floating gate from a polysilicon pad and a pair of first metal local interconnection layer (LIL) slit contacts deposited on a patterned dielectric layer; and
    fabricating a control gate from a pair of second metal LIL slit contacts deposited on the patterned dielectric layer;
    wherein the polysilicon pad and the pair of first metal LIL slit contacts together with the pair of second metal LIL slit contacts form a capacitive structure between the U-shaped floating gate and the control gate.

2. The method as claimed in claim 1, further comprising fabricating another portion of the control gate from a pair of metal contacts formed by patterning a metal layer.

3. The method as claimed in claim 1, wherein the first and second metal LIL slit contacts comprise tungsten.

4. The method as claimed claim 2, wherein the pair of metal contacts comprise tungsten.

5. The method as claimed in claim 1, wherein in the formation of a row of memory cells, the floating gate of each cell comprises the pair of first metal LIL slit contacts and the control gate of each cell comprises the pair of second metal LIL slit contacts; and
    each of the second metal LIL slit contacts is disposed adjacent to each of the respective first metal LIL slit contacts.

6. The method as claimed in claim 1, wherein in the formation of the non-volatile memory cell, the pair of second metal LIL slit contacts of the control gate extend continuously across one or more other non-volatile memory cells.

7. A non-volatile memory cell comprising:
    a U-shaped floating gate comprising a polysilicon pad and a pair of first metal local interconnection layer (LIL) slit contacts deposited on a patterned dielectric layer; and
    a control gate comprising a pair of second metal LIL slit contacts deposited on the patterned dielectric layer;
    wherein the polysilicon pad and the pair of first metal LIL slit contacts together with the pair of second metal LIL slit contacts form a capacitive structure between the U-shaped floating gate and the control gate.

8. The non-volatile memory cell as claimed in claim 7, wherein the control gate further comprises another portion fabricated from a pair of metal contacts formed by patterning a metal layer.

9. The non-volatile memory cell as claimed in claim 7, wherein the first and second metal LIL slit contacts comprise tungsten.

10. The non-volatile memory cell as claimed in claim 8, wherein the pair of metal contacts comprise tungsten.

11. The non-volatile memory cell as claimed in claim 7, wherein each of the second metal LIL slit contacts is disposed adjacent to each of the respective first metal LIL slit contacts.

12. The non-volatile memory cell as claimed in claim 7, wherein the pair of second metal LIL slit contacts of the control gate extend continuously across one or more other non-volatile memory cells.

* * * * *